(12) United States Patent
Ershov (10) Patent No.: US 7,573,077 B1
(45) Date of Patent: Aug. 11, 2009

(54) THYRISTOR-BASED SEMICONDUCTOR MEMORY DEVICE WITH BACK-GATE BIAS

(75) Inventor: Maxim Ershov, San Jose, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 196 days.

(21) Appl. No.: 11/122,932

(22) Filed: May 4, 2005

(51) Int. Cl.
*H01L 29/74* (2006.01)

(52) U.S. Cl. .................. 257/146; 438/133; 363/27; 365/94; 365/104; 365/105

(58) Field of Classification Search ................ 257/146; 438/133, 135–138; 365/95–105; 363/27
See application file for complete search history.

(56) References Cited

U.S. PATENT DOCUMENTS

| | | | |
|---|---|---|---|
| 4,759,030 A * | 7/1988 | Murayama et al. ............ 372/96 |
| 4,965,872 A | 10/1990 | Vasudev | |
| 5,448,104 A | 9/1995 | Yallup | |
| 5,627,401 A | 5/1997 | Yallup | |
| 6,229,161 B1 | 5/2001 | Nemati et al. | |
| 6,448,586 B1 | 9/2002 | Nemati et al. | |
| 6,462,359 B1 | 10/2002 | Nemati et al. | |
| 6,492,662 B2 | 12/2002 | Hsu et al. | |
| 6,512,274 B1 | 1/2003 | King et al. | |
| 6,528,356 B2 | 3/2003 | Nemati et al. | |
| 6,545,297 B1 | 4/2003 | Noble, Jr. et al. | |
| 6,552,398 B2 * | 4/2003 | Hsu et al. .................... 257/350 |
| 6,583,452 B1 | 6/2003 | Cho et al. | |
| 6,611,452 B1 | 8/2003 | Han | |
| 6,627,924 B2 | 9/2003 | Hsu et al. | |
| 6,790,713 B1 * | 9/2004 | Horch ........................ 438/135 |
| 2001/0017392 A1 * | 8/2001 | Comfort et al. ............. 257/410 |
| 2004/0156233 A1 * | 8/2004 | Bhattacharyya ............. 365/176 |

OTHER PUBLICATIONS

Farid Nemati et al., U.S. Appl. No. 10/706,162, filed Nov. 12, 2003, *Thyristor Circuit and Approach for Temperature Stability*, assigned to the assignee of the present application.
F.Nemati and J.D. Plummber, *A Novel High Density, Low Voltage SRAM Cell with a Vertical NDR Device*, VLSI Technology Technical Digest, 1998.
F.Nemati and J.D. Plummber, *A Novel Thyristor-based SRAM Cell (T-RAM) for High-Speed, Low-Voltage, Giga-Scale Memories*, International Electron Device Meeting Technical Digest 1999.
National Scientific Corp., *TMOS Memory Cell, Breakthrough Technology in SRAM*, at http://www.nsclocators.com/images/pdf/IP_tmos-2003.PDF, 2003.
R.Colin Johnson, *Hybrid Tunnel Diodes Could Leapfrog Moore's Law*, EE Times, Oct. 29, 2003, also at www.eetimes.com/at/news/OEG20031029S0015.

\* cited by examiner

*Primary Examiner*—Jerome Jackson, Jr.
*Assistant Examiner*—Jami M Valentine
(74) *Attorney, Agent, or Firm*—Fields IP, PS (57) ABSTRACT

In accordance with an embodiment of the present invention, a thyristor-based semiconductor memory device may comprise an array of thyristor-based memory formed in an SOI wafer. A supporting substrate may be formed with a density of dopants sufficient to assist delivery of a bias level to the backside of an insulating layer beneath a thyristor. Such conductivity within the substrate may allow reliable back-gate control for the gain of a component bipolar device of the thyristor.

5 Claims, 9 Drawing Sheets

THYRISTOR-BASED SEMICONDUCTOR MEMORY DEVICE WITH BACK-GATE BIAS

RELATED DATA

This application is related to; and U.S. patent application Ser. No. 10/741,539 filed on Dec. 12, 2003, now U.S. Pat. No. 7,078,739 issued Jul. 18, 2006 (Adaptive gate bias for improving temperature stability of thyristor-based memory), which is a continuation-in-part of U.S. patent application Ser. No. 10/706,162, filed on Nov. 12, 2003, now U.S. Pat. No. 7,304,327 (Thyristor Circuit and Approach for Temperature Stability); the specifications of which are hereby incorporated by reference.

BACKGROUND

The present invention is directed to semiconductor devices and, more specifically, to thyristor-based memory devices and their fabrication on SOI wafers.

The semiconductor industry seems to continually strive for integrated circuits of greater density and complexity and, at the same time, seek reduced power consumption and package size. Recent advances, e.g., have brought forward single-die microprocessors with many millions of transistors that may operate at speeds of hundreds of millions of instructions per second. Such devices may now be packaged in relatively small semiconductor device packages either as stand-alones or together with other components as part of, e.g., a system on a chip (SOC).

An important part or component for most processing systems, including SOC solutions, is semiconductor memory. Conventional memory devices for storing digital data may include, e.g., SRAM and DRAM circuits. Typically, SRAMs have been used in applications calling for a high random access speed, while DRAMs, on the other hand, have been designated for high-density applications and those where a slower random access speed can be tolerated.

Recently, capacitively coupled thyristors have been introduced as a semiconductor memory that may provide both the speed of conventional SRAM and also the density of DRAM and as a solution that might also be accommodated with available CMOS processes. One type of thyristor-based memory may be described as a thin capacitively coupled thyristor ("TCCT") and may be known to be operable as a bi-stable element.

One design consideration for such thyristor-based memory cell, including the TCCT memory cell, is the holding current of the thyristor. The holding current of the thyristor may refer to the minimum current required to preserve the thyristor's forward conducting state. One aim, therefore, is to target a holding current sufficiently low so that the memory cell may have an acceptable standby current. For example, a holding current larger than a few nano-Amperes per cell could significantly impact its power dissipation and limit the maximum capacity of a thyristor-based memory within, for example, an expanded memory array solution.

Another important consideration when using a thyristor-based memory cell may be its sensitivity to environmental factors that may cause error when it is in the blocking state. A thyristor may be vulnerable to error responsive to various adverse environmental conditions such as noise, light, anode-to-cathode voltage changes and high temperatures. Such vulnerability can affect the operation of the thyristor and result in undesirable disruption of the contents of the memory cell. Accordingly, there may be a compromise in the desire to reduce its vulnerability to adverse conditions and the desire to achieve low standby current.

Furthermore, during manufacture of a thyristor-based memory, various doping, implant, activation and anneal procedures may be performed. Some of these procedures may also be dependent on masking as may be used during patterning for the doping and implant provisions, as well as for patterning for other structures, such as polysilicon for the electrodes. These various procedures—e.g., patterning, masking, doping, implanting, siliciding annealing, etc.—for fabrication of the thyristor memory may, therefore, be understood to contribute to its overall manufacturing complexity, cost and size. The tolerances available for each of these procedures and associated limitations in their reproducibility may also be understood to impact product reliability and yields.

SUMMARY

According to an embodiment of the present invention, a thyristor-based semiconductor memory device may be formed on an SOI wafer. An underlying supporting substrate may be doped with a high density of impurity to allow efficient back-gate control of the gain of bipolar devices constituting a thyristor. High substrate doping is required to avoid voltage drop on the substrate, and to prevent depletion and/or inversion of the top surface of the substrate under the thyristor. In one embodiment, a predetermined bias of fixed level may be applied to the substrate for the back-gate control.

In a further embodiment, an adaptive (temperature-dependent) voltage bias may be applied to the substrate for the back-gate control beneath thyristors of the thyristor-based memory device.

In another embodiment, a thyristor-based memory may comprise an array of memory cells, each of which may comprise a thin capacitively coupled thyristor (TCCT) and a transistor to enable selective access to the thyristor. A bias source may apply a voltage to the supporting substrate, for example, as a back-gate control for the gain of a bipolar component of the thyristor. A high density of dopants in the supporting substrate, e.g., at least about $10^{16}$ per cubic centimeter, may assist delivery of voltage levels received from the bias source to the backside of the thyristor. In a further embodiment, this bias source may be a temperature-dependent bias source and may generate a voltage level dependent on temperature to control of the gain of the bipolar component with respect to temperature.

In a further embodiment, the fabrication of a thyristor-based memory may include implant of dopant with dosage and implant energy sufficient to establish a high doping concentration in a surface region of the supporting substrate. In one preferred embodiment, the deep implant into the supporting substrate may be performed before formation of isolation trenches. A densification anneal used during formation of the isolation trenches may be understood to assist redistribution of the dopants previously implanted. In another embodiment, the implant into the supporting substrate may be performed after formation of the isolation trenches. The type of the implanted species may be the same or opposite to the type of the substrate doping, which may be of either n-type or p-type dopant. Alternatively, high substrate doping may be achieved without ion implantation by using SOI wafer fabricated by SOI wafer vendor using initially heavily doped substrate.

BRIEF DESCRIPTION OF THE DRAWINGS

Subject matter of embodiments of the devices and methods of manufacture to the present invention may be understood by reading the following description with reference to the accompanying drawings, in which.

DETAILED DESCRIPTION

In the description that follows, readily established procedures for the exemplary embodiments may be disclosed in simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

Embodiments of the present invention may be applicable to a variety of different types of thyristor-based memories, and have been found to be particularly useful for such devices benefiting from improved stability in the presence of disturbing environmental conditions such as high temperature, noise, light and voltage changes. While the present invention is not necessarily limited to such devices, various aspects of the invention may be appreciated through a discussion of various examples of this context.

As used herein, SOI wafer shall reference a supporting substrate (substrate), buried oxide (BOX), and top semiconductor layer. Top semiconductor layer may have one or more layers of material including, but not limited to Si, Ge, SiGe, and all other semiconductors that have been formed on or within the wafer. Layered semiconductors comprising the same or different semi-conducting material such as Si, Ge, SiGe, Si/SiGe, Si/SiC, etc. may be also included. These layers and/or additional layers may be patterned and/or may comprise dopants to produce devices (e.g., thyristors, transistors, capacitors, etc.) of an integrated of circuit. In forming these devices, one or more of the layers may comprise topographies of various heights. When referencing this integration of circuitry, therefore, it may be described as integrated together, on or within the wafer.

As referenced herein, portions of, e.g., a transistor or thyristor may be described as being formed in, at or on a semiconductor wafer. Such alternative terms in/at/on may be used individually merely for purposes of convenience. In the context of forming thyristor-based semiconductor memory devices, such terms may collectively reference portions of a semiconductor element that may be within and/or on a starting material. Further, specific examples herein may reference a supporting substrate of p-type dopants and may use a p-type dopant implant (e.g., boron) or n-type implant (e.g., phosphorus) to increase a density of dopant. It will be understood, however, that some embodiments may use an n-type doped supporting substrate and an implant of n-type or p-type dopants for increasing its conductivity.

Figure 1A:
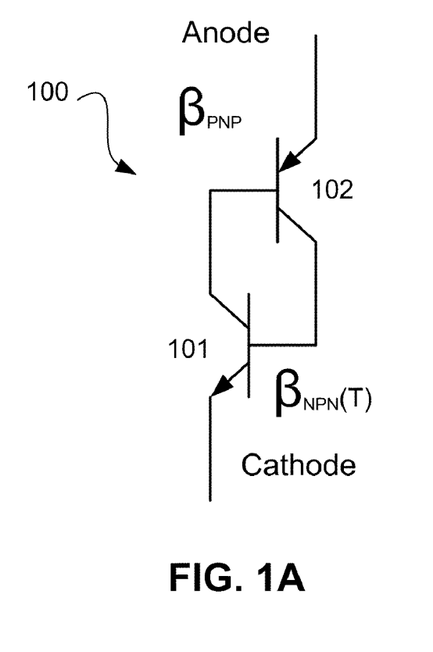
FIG. 1A is a schematic diagram of a thyristor represented with two bipolar transistors, as may be useful for gaining an understanding to certain embodiments of the invention.

Referencing FIG. 1A, a thyristor 100 may be simplistically represented or modeled as comprising an NPN bipolar transistor 101 and a PNP bipolar transistor 102 cross-coupled base-to-collector and collector-to-base. The gains $\beta_{NPN}$ and $\beta_{PNP}$ associated with these transistors may influence the operating characteristics of the thyristor. When applying a voltage to the anode, the thyristor may initially resist current flow within its non-conductive state, as represented by the thyristor I-V characteristic curve 120 (FIG. 1C) between its off-state bias 122 and bias 124 for an applied voltage less than the blocking threshold voltage $V_{FB}$. Upon exceeding a blocking threshold voltage $V_{FB}$, the thyristor may transition to a conductive region as represented by point 128 for an on-state condition.

Figure 1B:
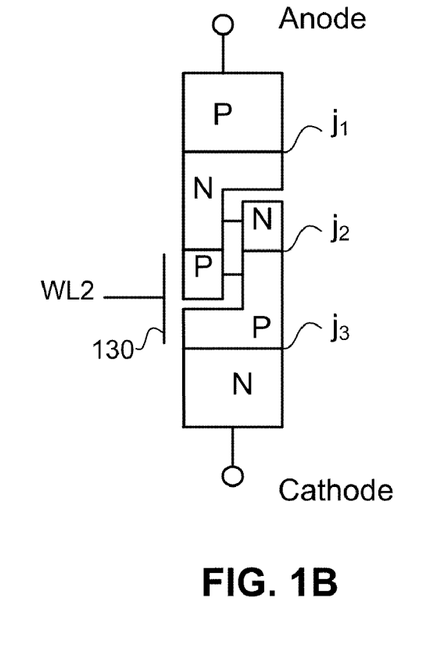
FIG. 1B is an alternative schematic diagram and cross-sectional diagram representing the thyristor, useful to gain an understanding to certain embodiments of the invention.

Further referencing FIG. 1B, a thyristor for a memory application, for example, may incorporate electrode 130 capacitively coupled to a base region of the thyristor. By applying voltage modulation to electrode 130, certain typical thyristor operations may be performed more reliably or rapidly.

Figure 1C:
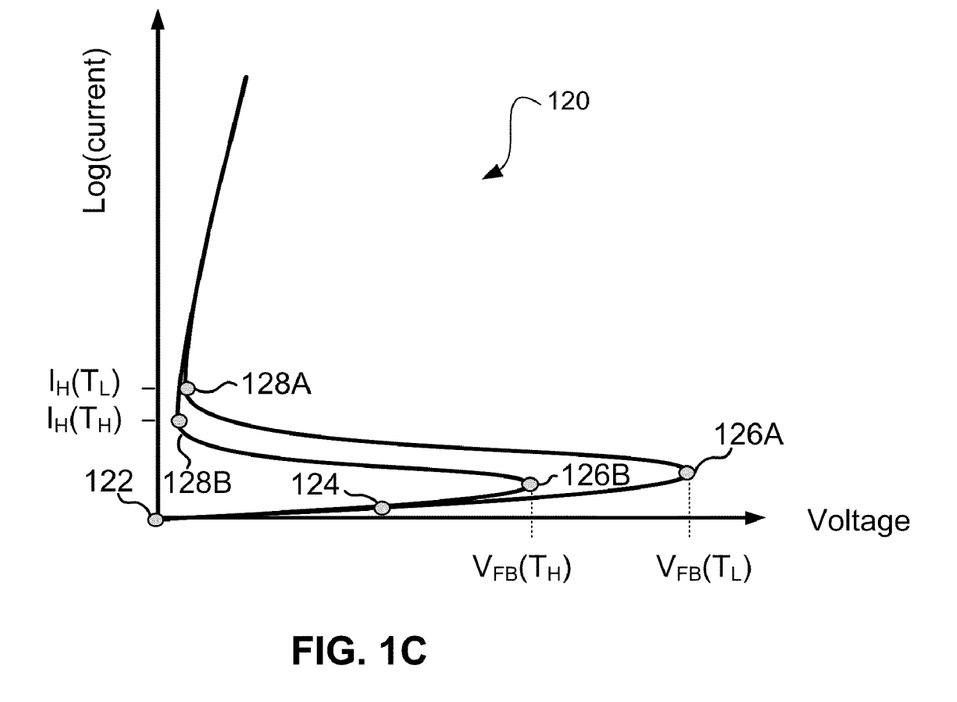
FIG. 1C is a graph illustrating current versus voltage characteristic of a thyristor at different temperatures, useful to gain an understanding to certain embodiments of the invention.
Figure 2A:
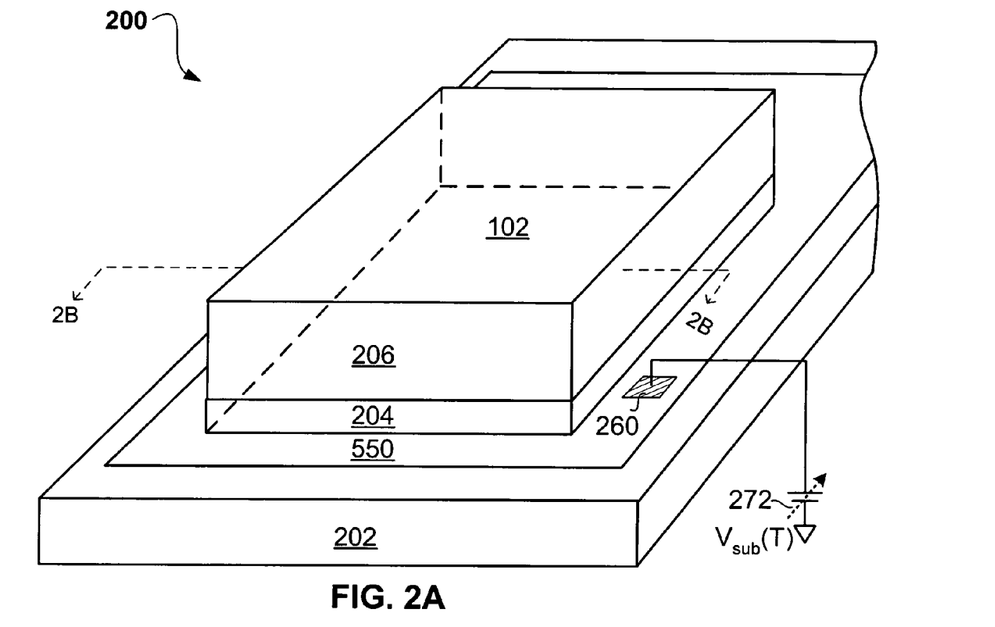
FIG. 2A is a simplified perspective and schematic view of a silicon-on-insulator ("SOI") wafer for a thyristor-based semiconductor memory device, in accordance with an embodiment of the present invention, showing a voltage bias applied to a region of the supporting substrate for delivery beneath the thyristor-based memory.
Figure 2B:
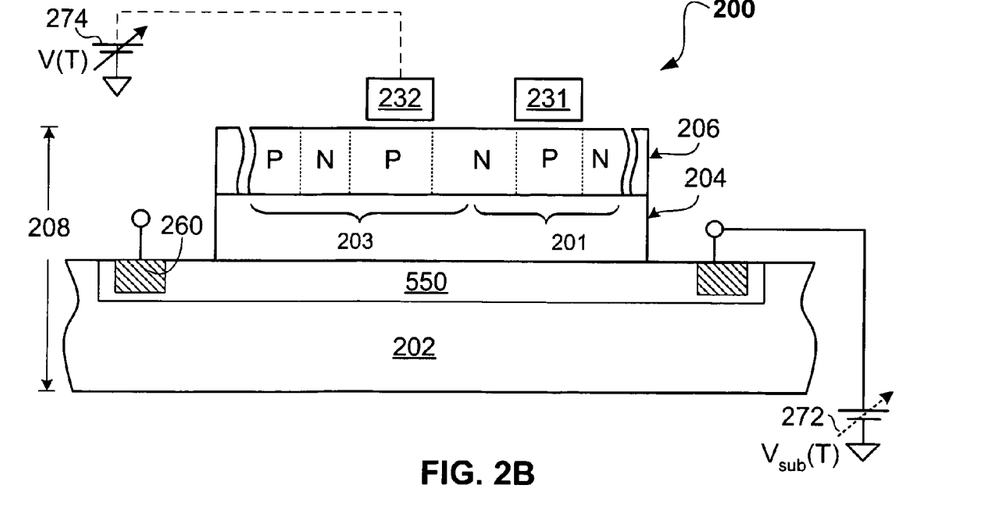
FIG. 2B is a simplified cross-sectional view and schematic representation for the SOI semiconductor device of FIG. 2A, and showing a surface region of high conductivity for the supporting substrate beneath the thyristor-based memory.
Figure 2C:
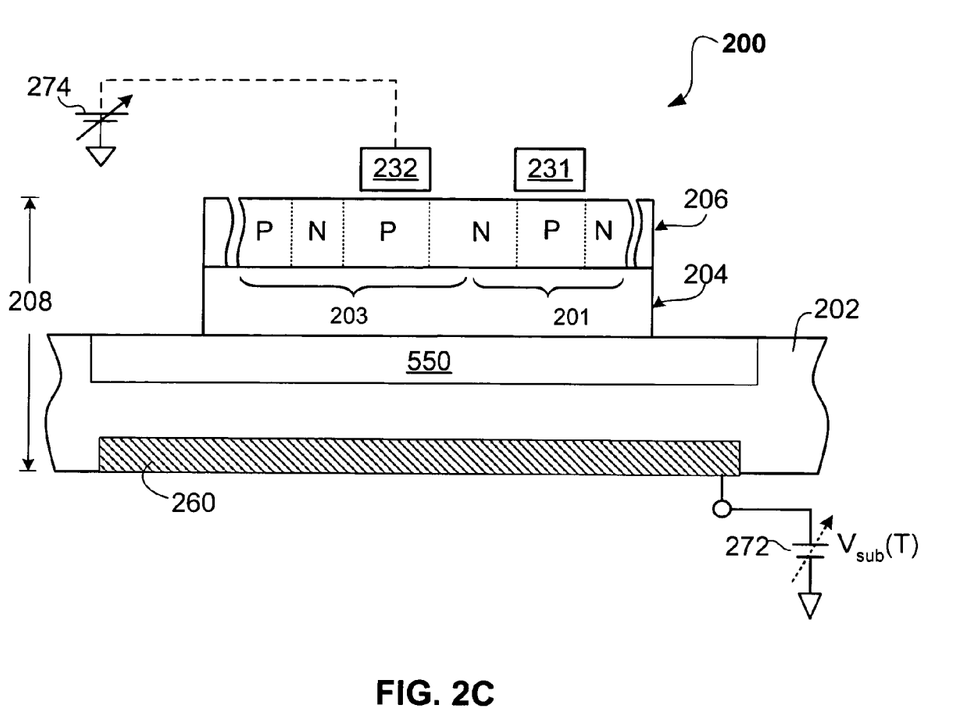
FIG. 2C is a simplified perspective and schematic view of a silicon-on-insulator ("SOI") wafer for a thyristor-based semiconductor memory device, in accordance with an embodiment of the present invention, showing a voltage bias applied to a back-side of the supporting substrate.

Relative to thickness, referencing FIGS. 2A-2C, the capacitively coupled thyristor 203 may be formed in serial arrangement with access transistor 201 in a thin layer of silicon 206 of an SOI wafer 208. The thyristor and transistor together may define, at least in part; a portion of a thyristor-based memory array 102. If the silicon layer 206 is sufficiently thin, electrode 232 over the p-base region of thyristor 203 may be activated to assist depletion of carriers in the p-base during certain write operation of the thyristor-based memory. For example, when transitioning the thyristor from a conducting state 128 (FIG. 1C) to a non-conducting state 122, it may be desirable to bump the voltage of the capacitor electrode 232 in order to assist depletion of minority carriers in the base region. Otherwise, a longer duration might be required for transitioning the memory element from a conducting to a non-conducting condition, which would depend on the typical recombination or lifetime of carriers within the base region.

Further referencing FIGS. 1C and 2B-2C, the blocking voltage $V_{FB}$ for the thyristor and the holding current $I_H$ required for an on-state (or conductive state) condition may be understood to depend on the gain of the component bipolar devices, which in turn may depend on the length and doping densities of the base regions and their respective emitter regions. In a broad sense, the integrated amount of dopants provided for a base region along the base length relative to the integrated amount of dopants provided for an emitter region along the emitter length thereof may be used to estimate and/or target the gain of a bipolar device. Accordingly, designs for establishing a given gain to a bipolar device may target certain ratios between the integrated base doping and the integrated emitter doping (known as the base and emitter Gummel numbers, respectively) and may be guided by principles of known Gummel number relationships and equations available from bipolar transistor theory. In general, it may be understood that a device designed with a short base and/or light base doping may contribute to a high gain (beta).

When operating thyristor-memory over a range of temperature, the gain of the bipolar devices may increase at higher temperatures and may decrease at low temperatures. At a low operating temperature, the bipolar elements of the thyristor may experience a reduced gain, which may make it more difficult to turn the thyristor on.

Alternatively, at higher operating temperatures, the bipolar components of the thyristor may exhibit increased gain, which may make it difficult to write or maintain an off state condition. Again, referencing FIG. 1C, the increased gain at the high operating temperature may reduce the blocking voltage $V_{FB}$ of the bias point 126B effective to transition the thyristor from an off state to a conductive condition. This may be viewed as revealing a vulnerability of the thyristor device to noise. Thus, the high temperature may increase the gain of a bipolar component such that it may be more susceptible to toggle from one state to another state under the influence of noise.

Figure 3A:
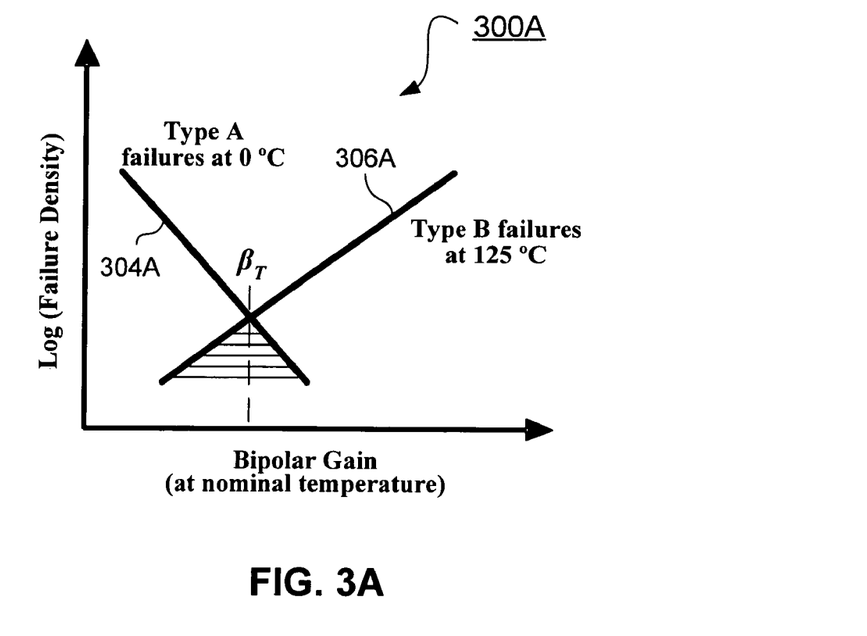
FIG. 3A is a simplified exemplary design template showing a first "error-density versus gain" curve for mapping "Type A" failures at a low-temperature operating condition and a second "error-density versus gain" curve for modeling "Type B" failures at a high-temperature operating condition for a typical thyristor-based memory.

Referencing FIG. 3A, a design template 300A may be used by some designers to assist selection of a target gain for the fabrication of a thyristor memory device. The gain for the component bipolar device of a thyristor may be selected based upon modeled error probabilities at given temperatures of operation. A first curve 304A of a design selection template 300A may characterize an error density or error probability of a thyristor device for a certain type of failure (called "Type A") at a low operating temperature, such as 0° C. It may be observed that by selecting a sufficiently high target gain for the component bipolar devices of the thyristor, a low "Type A" failure rate may be readily achieved. On the other hand, maintaining such low error probability for another type of failure (called "Type B") when operating the typical device at high temperatures, per the error-density curve 306A, may prove problematic for high gain selection.

Accordingly, a compromise may exist between a suggestion for a low gain design for high temperature operation and the opposing suggestion for a high gain design that may preserve performance at low temperature operation. In some instances, a method of fabrication for a thyristor device might thus target a narrow design region for a specified gain ($\beta_T$) that may be able to yield, per typically known embodiments, devices operable to maintain operability over a range of operating temperatures. Compounding the problem, however, may also be variances in processing steps associated with fabrication of semiconductor devices. These variances may have the effect of shifting actual gain realizations away from a targeted gain ($\beta_T$ of FIG. 3A) so as to potentially result in excessive error probabilities and low production yield for some typical designs for thyristor-based memory devices.

Referencing FIGS. 2B-2C, in accordance with embodiments of the present invention, the surface region 550 (relative to FIG. 2B) or a region 552 (FIG. 2C) of the supporting substrate beneath the memory array may be formed with conductivity sufficient to deliver back biasing 272 to regions beneath thyristor 203 of memory array 102 in an SOI wafer. More specifically, for example, a thyristor-based memory 200 may comprise a thyristor 203 and an access transistor 201 that may be formed in a layer of silicon 206 disposed over buried oxide 204 and over supporting substrate 202 of a silicon insulator SOI wafer structure 208. In a particular embodiment, buried oxide 204 may comprise a thickness of about 1,000 to 2,000 angstroms. The layer of silicon 206 may comprise thickness less than about 2,000 angstroms. Given a light doping level of the P-base region and an associated vulnerability to electric field influences, a high conductivity may be provided for the supporting substrate beneath this P-base region to enable more reliable delivery of a back-gate bias. The supporting substrate of the high conductivity may thus assure reliable delivery of a voltage received, e.g., from either a fixed or adaptive bias source.

For example, in one embodiment, the bias source may apply a voltage level to the substrate of magnitude dependent on temperature. Its variation with respect to temperature, in turn, may be predefined to control certain electrical properties of the thyristor with respect to temperature. With a high conductivity within the supporting substrate 202, it may reliably deliver the bias received from the bias source to the region beneath the thyristor.

In accordance with further embodiments, electrode 232 disposed over and capacitively coupled to the P-base region might also receive a bias from a temperature dependent voltage source 274.

Dependent upon the level of doping of P-base region and the thickness of the layer of oxide 204, the gain ($\beta_{NPN}$) of the NPN bipolar device associated with thyristor 203 may be controlled, in certain embodiments, with a voltage range as high as 0 to ±5 volts, or as low as 0 to ±3 volts.

Again, relative to the N-base region, the P-base region of the thyristor may be more susceptible to majority carrier (hole) modulation via the voltage adjustments to the supporting substrate. With the low density of dopants within the P-base region, the voltage changes of the supporting substrate may impact a greater portion or thickness of the P-base region for displacement of a given amount of charge carriers toward or away from the supporting substrate. This displacement may impact the depth at which the majority of current flows within the P-base region and, thus, the gain of the associated NPN transistor. Further, it may be seen that the ability of supporting substrate 202 to deliver the applied bias level to the backside of the bipolar device may similarly be understood to influence the effective relationship between control of the back-gate bias and the gain of the bipolar device.

In terms of Gummel numbers, the gain may be understood to depend on the ratio of the integrated emitter majority carrier concentration and the integrated base majority carrier concentration. Simplistically viewed, a calculation for the base Gummel number in a real three-dimensional structure may be thought of as being performed along the path where the integrated majority carriers may effectuate the smallest value. That is, if we integrate from the left side to the right side of the P-base region, the integral path may traverse the dopant profile's contour location where the majority carriers are of lowest density. With a light doping profile for the P-base region, it may be understood that an electric field influence as effected by a voltage presented by the supporting substrate 202 (e.g., of either a residual parasitic effect or that of an applied bias) may adjust the carrier distribution within the base region and the resulting gain of the bipolar device for the thyristor. With high dopant concentration in the supporting substrate beneath the buried oxide, in accordance with an embodiment of the present invention, a vulnerability to residual parasitic effects may be reduced and the bias levels applied to the supporting substrate may be reliably delivered as the back-gate control beneath the thyristor regions.

Further referencing FIGS. 2B-2C, it may be further understood that when the buried oxide reaches a finite thickness (e.g., less than 5,000 angstroms), the gain of an inherent NPN bipolar device may be found potentially more vulnerable to parasitic effects within the substrate and potentially more sensitive to voltage variations within the supporting substrate. In accordance with a particular embodiment, at least a surface region of the supporting substrate may be formed with a density of impurities (e.g., dopant) for achieving conductivity sufficient to overcome risks of parasitic effects and to reliably deliver bias levels of a bias source 272 to the backside of the thyristor device.

In a particular embodiment, bias source 272 may comprise a temperature sensing circuit to sense a temperature and cause a generator to source a voltage of magnitude dependant upon the temperature sensed. The bias source 272 may be electrically coupled to supporting substrate 202 to deliver the applied voltage to a surface region 550 (FIG. 2B) or a central region 550 (FIG. 2C) of the supporting substrate opposite a memory array thereover. These regions of high conductivity may assist the delivery of the voltage to the region beneath the thyristor-based memory array 102 of the silicon layer 206.

For particular embodiments of the invention, further referencing FIGS. 2A-2C, the voltage of the bias source 272 may be applied to the supporting substrate by way of contact 260. Contact may be representative of known methods/circuitry solutions for electrically interfacing adaptive bias source 272. For example, in one embodiment, the region 260 of the supporting substrate to receive the applied bias may comprise a known ohmic contact region to the semiconductor material. The contact may be electrically interfaced by way of a conductive via through the silicon layer 206 of SOI substrate 208 and/or electrical interconnects to a temperature dependent generator. Alternatively, it may be applied to the backside of the supporting substrate (FIG. 2C). The generator may be formed either integrated internally with the thyristor-based semiconductor memory device as a self-contained integrated solution or via an interfacing I/O line and pin of the thyristor-based semiconductor memory device for a composite I.C. solution. Further, the interface to the contact region 260 may be disposed in a peripheral region of the supporting substrate laterally outside the area of array 102 of the thyristor-based memory as represented simplistically by FIGS. 2A-2B. Alternatively, the contacts to the supporting substrate may be made through windows within the array region 102, e.g., as may be accommodated through insulated trench structures between different active regions of the semiconductor memory device. Or, as referenced in FIG. 2C, applied to a backside of the supporting substrate.

In a further embodiment, the region 260 of substrate 202 to receive the voltage of the adaptive bias 272 may be driven by known "pump" circuits. The adaptive bias 272 might thus comprise pump circuitry for pumping charge to/from the supporting substrate for adjusting its voltage level.

In an embodiment of the present invention, further referencing FIG. 2B, second wordline electrode 232 may propagate a wordline control signal to assist writing/reading of the thyristor cell during access of the thyristor memory. In some applications, this electrode may also receive a bias 274 of a temperature dependent level, which in turn may assist influencing the gain of the bipolar component of the thyristor. As the bias levels change with temperature, they may distribute carriers within a base region and may stabilize the gain of the bipolar component of the thyristor across a temperature range.

Further referencing FIGS. 2A-2C, to assist the stability and reliability of the memory cells of the memory array 102 relative to temperature, bias source 272 may provide a voltage that varies with respect to temperature and may be delivered and coupled capacitively to the backside of respective base regions of the thyristor memory cells across the array. In some embodiments, the voltage level applied from the bias source may change with respect to temperature by a predefined relationship to stabilize operability for the memory device over a broad range of temperatures. In this manner, each of the devices may be influenced (with adaptive gain adjustment) for compensating certain operative effects with respect to temperature.

In a proposed theory of understanding, the bipolar gain of a bipolar device within a thyristor may be understood to decrease with decreasing temperature. An adaptive bias voltage may be designed to change with temperature. This voltage can be used to compensate the temperature-dependent modulation of the bipolar gain. The resulting loop gain (the product of NPN and PNP gains) might thus appear flat and more stable across a given temperature range. Accordingly, the adaptive bias may be described as compensating, at least in part, the inherent gain sensitivity with respect to temperature for achieving more stable and reliable thyristor-based memory operation across temperature ranges.

Figure 3B:
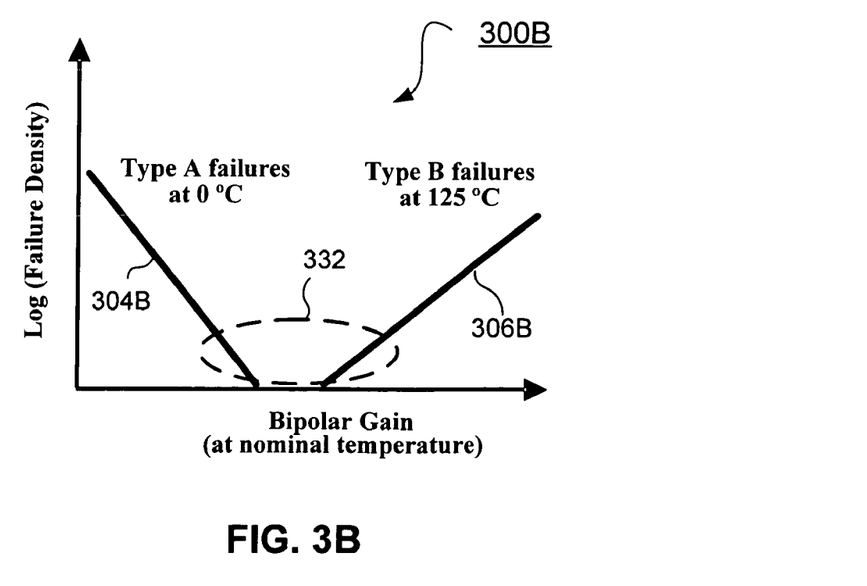
FIG. 3B is a simplified exemplary design template for a thyristor-based memory according to an embodiment of the present invention, showing a wider "design window" as may be available relative to a first curve for modeling "Type A" failures at a low-temperature operating condition and a second curve for "Type B" failures at a high-temperature operating condition, as may be useful for offering an understanding for certain embodiments of the invention.

One of the benefits for the adaptive biased thyristor-based memory, referencing FIG. 3B relative to FIG. 3A and in accordance with embodiments of the invention, is provision of a larger design window 332 that may be available for section of bipolar gains within the design template 300B as illustrated in FIG. 3B. The greater range of operable gains for the fabrication of thyristor devices may be appreciated by simplistically contrasting window 332 of the design template 300B of FIG. 3B relative to the target gain $\beta_T$ depicted by template 300A of FIG. 3A.

During operation of the thyristor memory at low temperature conditions, the voltage applied by an adaptive voltage source 272 (FIGS. 2B-2C) may increase the gain of the PNP bipolar device and, therefore, decrease the holding current as may be necessary to maintain the state of the thyristor in an on-state condition. Referencing FIG. 3B relative to FIG. 3A, this influence may be characterized as shifting the Type A failure (e.g., one-data failure) curve 304 at 0° C. to the left so as to establish lower defect probabilities at a given selection of bipolar gain.

In contrast, during high temperature operation, the voltage bias of the supporting substrate capacitively-coupled to the backside of the base region may serve to decrease the bipolar gain of the thyristor and increase the effective forward blocking voltage of the thyristor. Accordingly, the probability for "Type B" failure may be reduced. This may be viewed or understood to be equivalent to shifting the "Type B" failure curve 306 at 125° C. to the right for the effective design template 300B.

In some embodiments, adaptive voltage source 272 may supply a voltage level that shifts non-linearly with respect to temperature. For example, it may sense a first threshold temperature; change a level before adjusting its output voltage from a high or low level. Similarly, it may shift the voltage level in a step-like fashion across a plurality of different first, second, third . . . temperature thresholds. Further, a variety of preliminary tests may be performed for different semiconductor devices, and the adaptive voltage characteristics desired for a variety of different temperatures may be obtained and used to adjust the voltage-versus-temperature gain distributes for adaptive bias source 272 for controlling the bipolar gains with predetermined compensation. In a further embodiment, the threshold temperatures might be pre-programmed within a controller or read-only memory and used for adjusting the voltage levels to be applied to the supporting substrate capacitively coupled to the backside of a base region of the respective thyristors of the thyristor memory.

Typical SOI wafers for thyristor-based semiconductor memory device may have a light doping level in the supporting substrate—i.e., on the order of $10^{15}$ per cubic centimeter. As recognized herein, such low level of doping density may be found to hinder delivery or coupling of an applied bias for control of the gain of the bipolar component within the thyristor. It may be understood that when a voltage is applied to the silicon layer over the supporting substrate, it may induce an electric field in the supporting substrate. Under the influence of such electric field, a portion 250 (FIG. 5A) of the typical supporting substrate of low doping density proximate the buried oxide may be depleted of majority carriers. Such depletion region may be understood to effectively widen a thickness of the dielectric. Further, should the voltage level of the silicon layer exceed a given threshold, an inversion layer might also be formed in the supporting substrate proximate the buried oxide (BOX) layer.

For these typical thyristor-based semiconductor memory devices realized on these types of SOI wafers, the vulnerability of the supporting substrate to depletion and associated conductivity loss may lead to voltage drops across the depletion region and/or across the lowered conductivity regions of the supporting substrate. Such voltage drop(s) may undermine an ability to readily or reliably control characteristics of the thyristor device. Further, for embodiments having a temperature adaptive bias source, the design therefore may require more robust realizations in order to achieve greater voltage magnitude or greater drive capability as may be required to overcome the potential voltage drops in the supporting substrate.

In addition to the compromise of voltage drop, the low doping density in the supporting substrate of the typical SOI structured thyristor-based memory may also be found to introduce slow parasitic transient effects. These effects are caused by the slowness of the establishment of the inversion layer in the absence of an ohmic contact to this layer. The physical mechanisms responsible for generation of the (electron) inversion layer are thermal electron-hole generation in the depletion layer and/or diffusion of minority carriers (electrons) in the undepleted part of the p-type substrate towards the depletion layer. Both of these mechanisms may be very slow, especially at low temperatures. These imprinted depletion regions that may be formed in the supporting substrate of low carrier concentration may thus respond very slowly to changes in voltage that may occur in the thyristor. Thus, as further recognized herein, the possible formation of imprinted regions may present lag characteristics or limitations in transient responsiveness, wherein time-constant characteristics may be found with perhaps tens of seconds or longer.

It may be theorized that this long time-constant characteristic may depend on the carrier lifetime properties, which in turn may depend on the thermal generation properties for the semiconductor material associated with the depletion region. Regardless of the proposed theory, the slow parasitic transient effects of the typical SOI fabricated thyristor-based semiconductor memory devices may be found to introduce time and/or history dependent influences upon individual memory cells across a memory array of the overall device. It is further recognized herein that such vulnerability may become more pronounced and onerous for SOI realizations that may use buried oxide layers of finite thickness—e.g., less than about 5000 angstroms.

According to certain embodiments of the present invention, referencing FIGS. 4 and 5A-5D, a supporting substrate 202 of an SOI structure 208 supplied with a p-type dopant of low concentration—e.g., $1-2 \times 10^{15}$ per cubic centimeter—may be further processed 402 for obtaining an enhanced dopant concentration 207 in at least a surface region 550 of the supporting substrate proximate the buried oxide layer 204. This enhanced dopant concentration 207 may substantially increase a conductivity across the substrate and may also reduce its vulnerability to carrier depletion and/or inversion in the interface region 550 proximate the buried oxide beneath the memory array.

Figure 4:
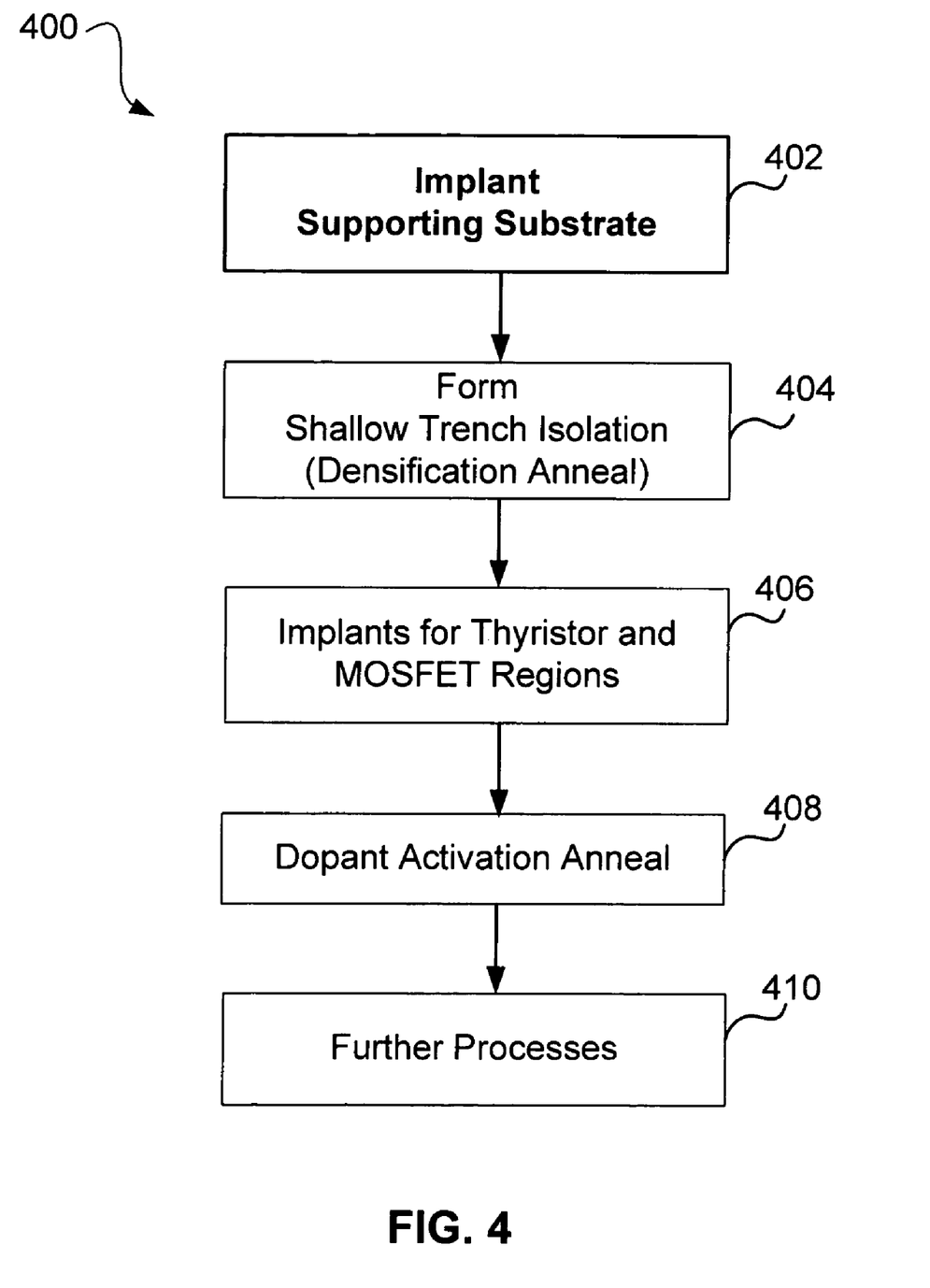
FIG. 4 is a simplified process flow diagram for a method of fabricating a thyristor-based semiconductor memory device, and showing implantation doping of a supporting substrate prior to forming shallow isolation trenches in an SOI structure, in accordance with an embodiment of the invention.
Figure 5A:
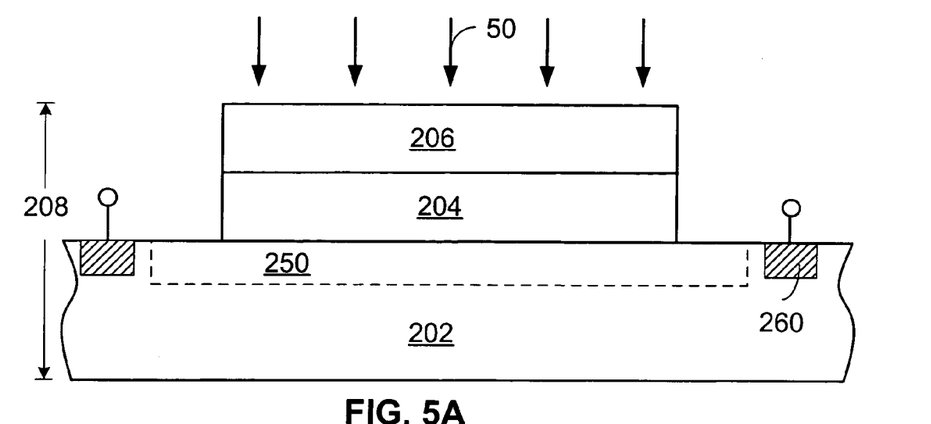
FIG. 5A is a simplified cross-sectional view of an SOI wafer in a stage of fabrication, and showing implanting of dopants such as boron to form a region of high doping density in the substrate supporting the silicon layer and the buried oxide of the SOI wafer, in accordance with an embodiment of the present invention.
Figure 5B:
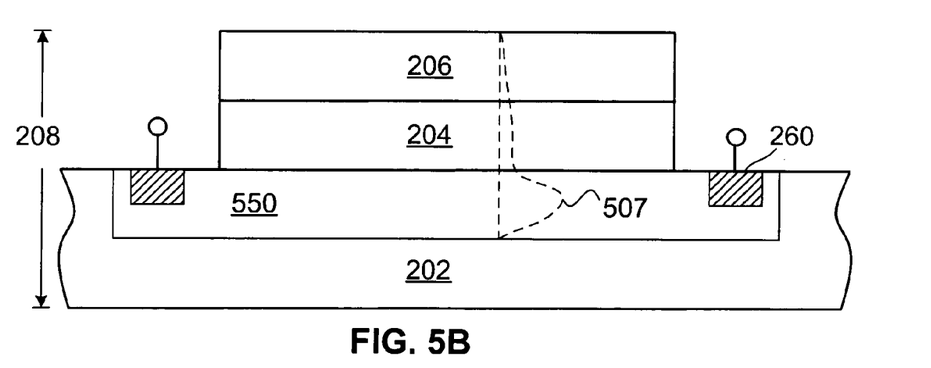
FIG. 5B is a simplified cross-sectional view of the semiconductor device of FIG. 5A in another stage of fabrication, showing the region of high conductivity in the substrate that encompasses a bias contact and also showing a doping profile in the substrate after the deep implant.

In a particular method 400 of fabricating a thyristor-based semiconductor memory device, further referencing FIGS. 4-5A, dopants 50 (i.e., of the same conductivity type as that supplied for substrate 202) may be implanted (block 402 of FIG. 4) deeply into the SOI structure 208 to enhance concentration 207 of dopants within at least the surface region 550 of the supporting substrate proximate the buried oxide and beneath an area of the silicon layer 206 for the memory array. The dopants 50 may be directed toward an upper surface of the silicon layer 206 using an energy sufficiently great to pass the ions of dopants (of sufficient imparted momentum) through the thickness of silicon layer 206 and buried oxide layer 204, and into surface region 550 (FIG. 5B) of the supporting substrate 202. The dosage for the implant may be selected sufficient to achieve a concentration for enhancement dopants in surface region 550 of, e.g., at least about $10^{16}$ per $cm^3$.

For example, assuming dopants of boron, a silicon layer of thickness of up to 1,000 angstroms, and a buried oxide layer of thickness up to 2,000 angstroms; the deep substrate implant may use an energy level of at least 100 keV. Further embodiments may use an energy from 110 to 170 keV and more preferably about 150 keV. Dosage for the boron enhancement implant may be set to a level as great as about $0.5$-$5.0 \times 10^{13}$ per square centimeter.

According to one embodiment, referencing FIG. 4, the implant of dopants may be performed relatively early within the flow for an overall fabrication process 400. For example, it may be performed before creating 404 the isolation trenches 116 (FIG. 5C).

Figure 5C:
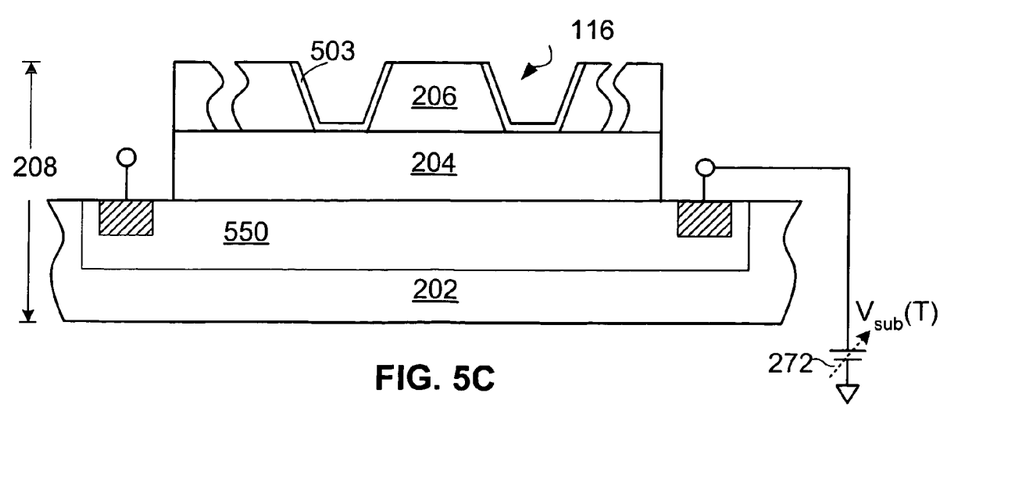
FIG. 5C is a simplified cross-sectional view and schematic representation of the semiconductor memory of FIG. 5B, showing active regions of the silicon layer over the supporting substrate in accordance with embodiments of the invention.
Figure 5D:
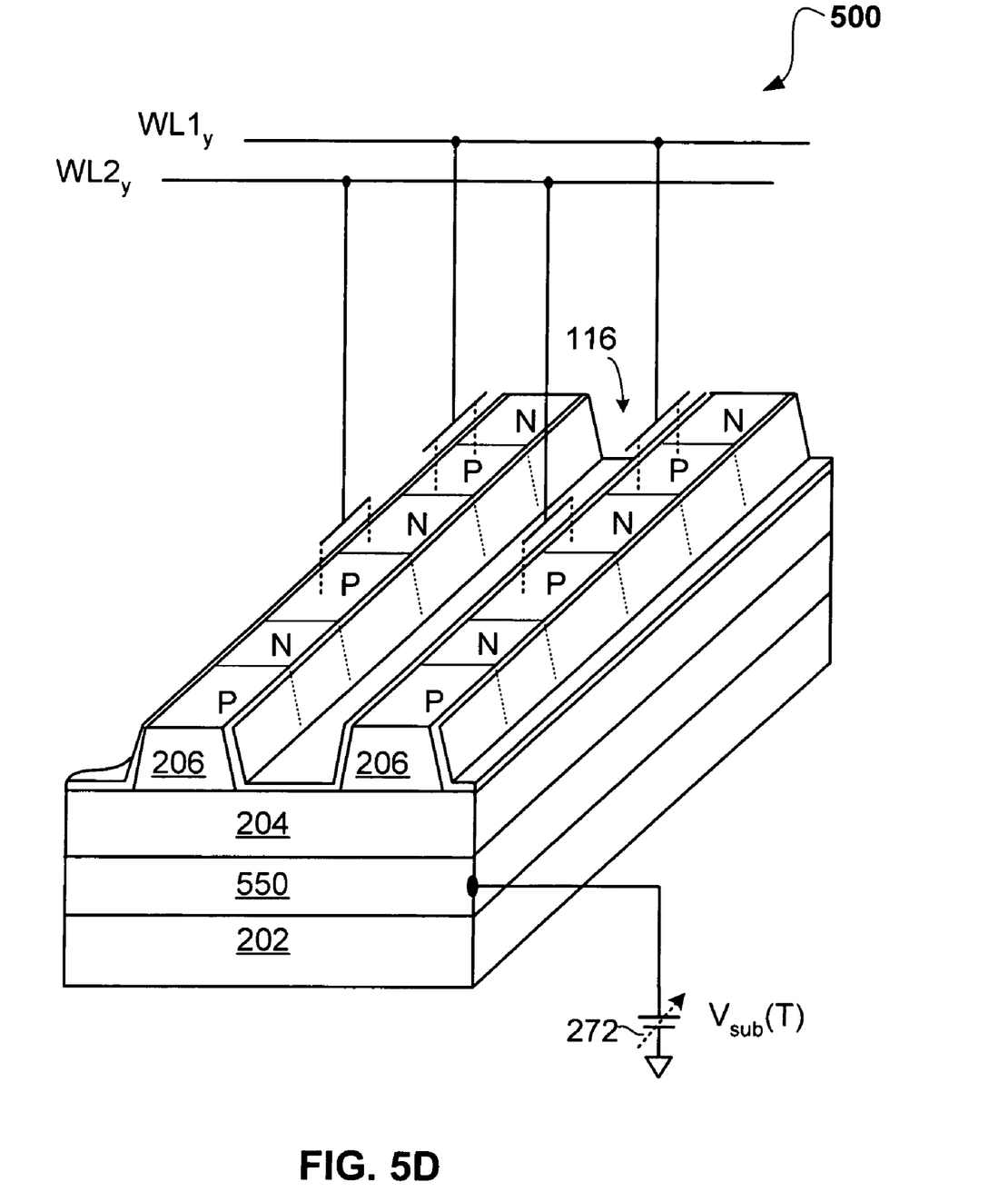
FIG. 5D is a simplified perspective and schematic view of the semiconductor memory of FIG. 5B, showing active regions of the silicon layer over the supporting substrate in accordance with embodiments of the invention.

Referencing FIGS. 4 and 5C-5D, isolation trenches (STI) may be formed in the thin layer of silicon 206 by patterning and etching of the silicon layer, which may define the separate active regions for the memory array—i.e., the different strips of silicon over the buried oxide. A thermal oxidation may form oxide 503 on the walls of the silicon that define the trenches. A deposition process might also be performed to further fill the trenches.

A densification anneal procedure (as a part of block 404 of FIG. 4) may then be performed to densify the insulating material. It is believed that a large thermal budget of the densification anneal may also serve to spread the dopants as represented by concentration profile 207 in the supporting substrate, which may have been previously defined by the enhancement implant.

With the large thermal budget available from the STI formation for diffusing the enhancement dopant, it may be understood that a greater energy might thus be permitted for the enhancement implant. The implant energy may be set to a magnitude sufficient to position the peak concentration of the dopant profile more deeply within the supporting substrate and also, more importantly, to reduce an amount of residual dopants that may be placed in the top silicon layer resulting from the tail-out of the concentration profile 207.

In one embodiment, the deep substrate implant of dopants 50 may define surface region 550 over the entire area of the supporting substrate 202. In another embodiment, surface region 550 (FIGS. 2A and 5B-5D) may define an area at least as great as that for a memory array to be formed in the silicon layer, while peripheral regions outside the surface region 550 may comprise dopant concentration less than that of the enhanced concentration 207. Further, the area defined by the surface region 550 of the dopant concentration may extend laterally to include and/or encompass the contact region 260 that is to receive the voltage of the adaptive base 272.

Following the deep substrate implant 402 and formation 404 of the isolation trenches 116, further referencing FIGS. 4 and 5C-5D, processing may continue for completing fabrication of the thyristor-based semiconductor memory device 500. For example, various regions of the silicon layer may be implanted 406 with appropriate dopants for defining respective base and emitter regions for the thyristor and respective drain, source and body regions for the MOSFET devices.

Dopant activation anneals 408 may also be performed for activating dopants of the oppositely doped polarity regions in silicon 206 for the thyristor and access devices to an array of memory cells (e.g., such as the array structure of FIG. 5D).

Back-end processing 410 may also be performed, for example, to form interconnects to voltage reference contacts of the thyristor anode-emitter regions and to couple bitlines to bitline-contacts at source regions of access transistors. Further, conductive lines for the voltage references, bitlines and/or wordlines may be formed in various metal layers over the substrate and may be separated from one another by various interlayer dielectrics and/or electrically interconnected by known interconnect provisions. Referencing FIG. 5D, the first and second wordlines $WL1_y$, $WL2_y$ and their associated relationship to electrodes for respective MOSFETs and thyristor base regions have been represented schematically along lines $WL1_y$ and $WL2_y$ associated with a given row "y" to an array. Referencing FIG. 7, these first and second wordlines 714,712 may be understood to cross multiple active regions and separate memory cells along the row of the array. Contacts, per this view, have been represented simplistically as X'ed circles for respective bitline and voltage reference contact regions on silicon strips 710.

In accordance with another embodiment of the present invention, referencing FIG. 6 relative to FIG. 4, the deep substrate implant 606 may be performed in a later stage of an overall flow for fabrication 600 of a thyristor-based memory device. In this embodiment, the implant 606 for increasing the density of dopants in a surface region of the supporting substrate may be performed after isolation trenches have already been defined 602. It may be understood, therefore, that the dopants of such deep substrate implant may not experience the large thermal budget that was available by the densification anneals of the former embodiment(s). Further, because the thermal exposure may not be as great for this embodiment, it may be understood that a concentration profile for the dopants resulting from this enhancement implant may not diffuse as much as that which was available by the former embodiment. Accordingly, to achieve a given concentration of dopants near the interface beneath the buried oxide; an energy level for the enhancement implant may need to be selected with magnitude less than that which was otherwise permitted by the former embodiment(s) described earlier with reference to FIG. 4. In other words, a lower implant energy for this embodiment may be needed in order to shift a peak for the concentration profile of the enhancement implant more proximate an interface as defined by the supporting substrate against the buried oxide. It may also be understood that the lower implant energy of this example, relative to former embodiment(s), may result in more residual dopants being placed in the top silicon layer as may be associated with a tail-out of the concentration profile.

Figure 6:
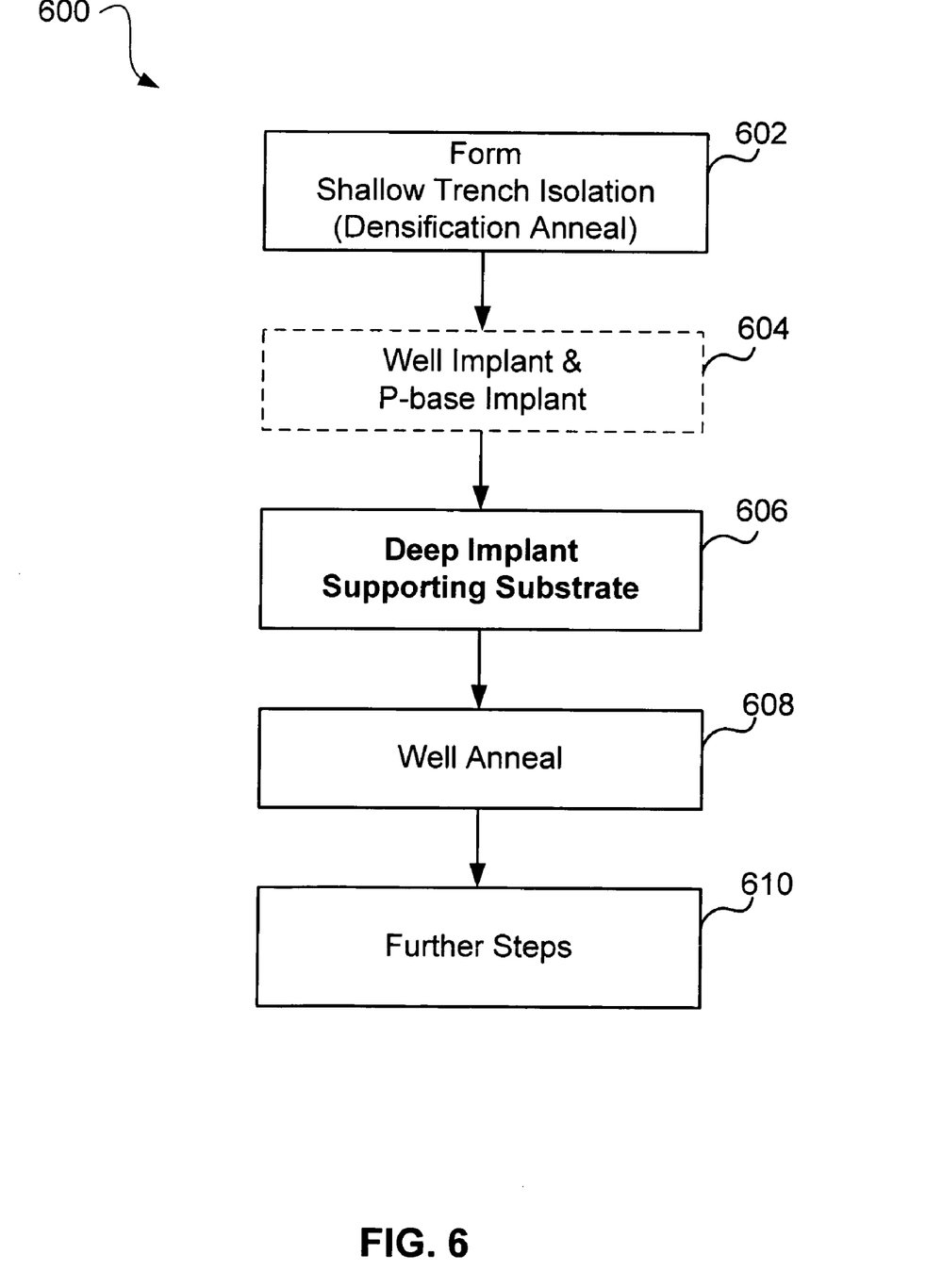
FIG. 6 is a simplified process flow diagram of fabricating a thyristor-based memory device, describing doping of a supporting substrate after forming isolation trenches, in accordance with an embodiment of the invention.

Further referencing FIG. 6, the deep substrate implant for this embodiment may be performed either before or after the implants defining well regions and/or also the implant for the base region of the thyristors. Thus, block 604 for the "Well Implant and P-Base Implant" has been represented in phantom in FIG. 6 for indicating that it may be performed either before or after the deep substrate implant (block 606 of FIG. 6). After performing these implant 604,606; processing may continue for completing fabrication of the thyristor-based memory device, including a step for annealing 608 the well implants.

In yet another embodiment, a process of fabricating a thyristor-based memory device may be performed as presently know, but in silicon of an SOI wafer that has been supplied over a supporting substrate of dopant concentration of at least $10^{16}$ per cubic centimeter. For example, a level of doping density for a supporting substrate of an SOI wafer available from an SOI wafer vendor may be in the range of $3 \times 10^{18}$ to $2 \times 10^{19}$ per cubic centimeter.

Figure 7:
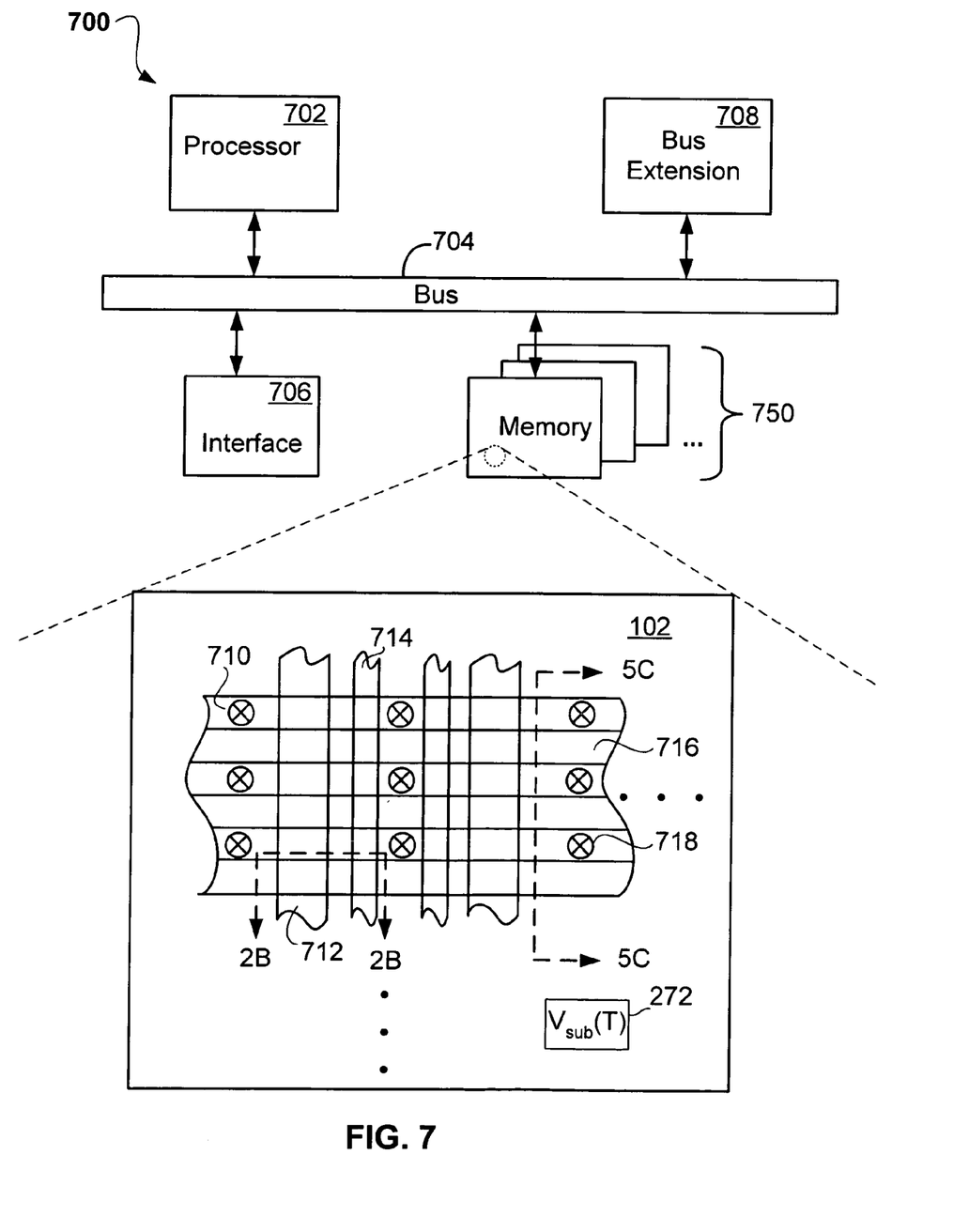
FIG. 7 is a functional block diagram of a simplified processing system and showing a partial exploded planar view for a thyristor-based RAM cells for certain embodiments of the present invention.

Further referencing FIG. 7, in accordance with further embodiments of the present invention, a data processing system 700 may comprise one or more memory modules 750 having at least one thyristor-based semiconductor memory device 102 of an embodiment as described previously herein. In accordance with a further embodiment, electronic system 700 may also comprise processor 702 in communication with the memory module(s) via bus 704. These elements may be collectively referenced as a computer system per one example of the system.

The data processing system 700 may further include an interface circuit 706 such as an input/output (I/O) device that may be coupled to processor 702 and/or memory modules 750 by way of bus 704. In particular embodiments, the interface 706 may comprise one or more of an interface to a monitor, a printer, a bulk storage device, a keyboard and/or a pointing device, etc. The system may also comprise bus extension circuitry 706 for supporting known bus interface exchange protocols, such as, parallel-to-USB and/or others.

Within an array of a thyristor-based memory 102, further referencing FIG. 7, memory cells may be formed in different portions of active regions, which may be patterned across a given area of the substrate for a plurality of rows and columns. The active regions for memory array 102 may be separated from one another by isolation trenches 716. It may be understood that contacts 718 may be operable to interface various signals, e.g., data signals, supplies and the like, to respective regions of the memory cells for the array. The supporting substrate may comprise a high conductivity for delivering the bias level received from bias source 272 to a location, as a back-gate control, beneath a thyristor of the thyristor-based memory. In a further embodiment, the bias source may be temperature adaptive for applying an adaptive voltage level to the supporting substrate dependent on temperature and to compensate, at least in part, a gain sensitivity for a bipolar component to a thyristor in the array with respect to temperature.

While certain exemplary features of the embodiments of the invention have been illustrated and described above, many modifications, substitutions, changes and equivalents may be available to those skilled in the art. It is, therefore, to be understood that the appended claims are intended to cover all such embodiments and changes as fall within the spirit of this invention.

What is claimed is:

1. A thyristor-based semiconductor memory device, comprising:
    a supporting substrate comprising at least one of semiconductor material and conductor material;
    dielectric layered on the supporting substrate;
    a layer of silicon disposed on the dielectric;
    the layer of silicon comprising doped regions of opposite sequential polarity that define a thyristor;
    a wordline electrode disposed in insulated relationship over a base region of the thyristor;
    a MOSFET with source, body and drain regions formed in at least a further portion of the layer of silicon over the dielectric, the drain region of the MOSFET physically shared in common, contiguous relationship with a cathode-emitter region of the thyristor; and
    a bias circuit electrically coupled to the supporting substrate to enable application of a given voltage to the supporting substrate when the memory device is operating;
    wherein at least a portion of the supporting substrate is conductively and operatively configured to enable receipt and delivery of the given applied voltage to a location beneath the thyristor to impart a back-side bias electric field effect to the thyristor when the bias circuit applies the given voltage to the supporting substrate.

2. The memory device of claim 1, in which the interface region of the supporting substrate beneath the thyristor and the MOSFET comprises a given dopant of density at least about $10^{16}$ per $cm^3$.

3. The memory device of claim 2, wherein the bias circuit is further operably configured to, when the device is operating, adjust the magnitude of the voltage applied to the supporting substrate with a voltage-versus-temperature dependency sufficient to compensate at least in part a given sensitivity in gain of the thyristor with respect to temperature.

4. The memory device of claim 2, in which the bias circuit is electrically coupled to an ohmic contact formed in the supporting substrate; and
    the interface region of the supporting substrate of the given dopant density comprises a lateral extent that encompasses the ohmic contact.

5. The memory device of claim 1, in which the bias circuit is operably configured to, when the device is operating, sense a temperature and adjust the magnitude of the voltage bias applied to at least one of the electrode and the supporting substrate based on the temperature sensed.

* * * * *